United States Patent
Maltabes et al.

(12) 
(10) Patent No.: US 6,620,563 B2
(45) Date of Patent: Sep. 16, 2003

(54) LITHOGRAPHY METHOD FOR FORMING SEMICONDUCTOR DEVICES ON A WAFER UTILIZING ATOMIC FORCE MICROSCOPY

(75) Inventors: John George Maltabes, Austin, TX (US); Alain Bernard Charles, Singapore (SG); Karl Emerson Mautz, Round Rock, TX (US)

(73) Assignee: Motorola, Inc., Schaumburg, IL (US)

( * ) Notice: Subject to any disclaimer, the term of this patent is extended or adjusted under 35 U.S.C. 154(b) by 127 days.

(21) Appl. No.: 09/801,522

(22) Filed: Mar. 8, 2001

(65) Prior Publication Data

US 2002/0127482 A1 Sep. 12, 2002

(51) Int. Cl.⁷ .................................. G03F 9/00
(52) U.S. Cl. .................................. 430/22; 430/30
(58) Field of Search ..................... 430/22, 30

(56) References Cited

U.S. PATENT DOCUMENTS

| | | | |
|---|---|---|---|
| 5,365,072 A | 11/1994 | Turner et al. | 250/491.1 |
| 5,701,013 A | 12/1997 | Hsia et al. | |
| 5,952,132 A * | 9/1999 | King et al. | 430/22 |
| 5,982,044 A | 11/1999 | Lin et al. | 257/797 |
| 6,392,229 B1 | 5/2002 | Dana et al. | |
| 6,421,457 B1 * | 7/2002 | Su | 430/22 |

OTHER PUBLICATIONS

Przybyla, J. et al., A Fully Integrated Photolithography Workcell, IEEE/SEMI International Semiconductor Manufacturing Science Symposium, 22–24 May, 1989, pp. 100–107, XP010085050, IEEE, New York.

* cited by examiner

Primary Examiner—Christopher G. Young

(57) ABSTRACT

A semiconductor device on a wafer is formed by lithography with the following steps of: coating (13) a lithography resist onto said wafer in a coating means (5), exposing (14) said wafer to an irradiation through a reticle in an exposure tool (4), stabilizing (15) said lithography resist for activating chemical reaction and developing said lithography resist in said predetermined areas in a developer means (6) so as to reveal a predetermined lithography resist pattern on the wafer surface, stabilizing (16) the lithography resist in a stabilization means (7) for strengthening said pattern on the wafer surface, performing (17) a metrology inspection of said lithography resist pattern on said wafer surface in a metrology tool (8), etching, wet processing or implanting ions (18) into said wafer in a processing cell (9), wherein said metrology inspection is performed by atomic force microscopy in a atomic force microscopy module (11) immediately after developing and baking said lithography resist adjacent to said stabilization means (7).

13 Claims, 4 Drawing Sheets

LITHOGRAPHY METHOD FOR FORMING SEMICONDUCTOR DEVICES ON A WAFER UTILIZING ATOMIC FORCE MICROSCOPY

RELATED APPLICATION

This application is related to the commonly assigned application entitled "Lithography Method for Forming Semiconductor Devices with Sub-micron Structures on a Wafer and Apparatus", also filed by applicants Charles et al. in the United States Patent and Trademark Office, identified by docket number SC0197WD.

FIELD OF THE INVENTION

The present invention generally relates to large scale integration semiconductor devices and in particular, though not exclusively, to a lithography method for forming at least one semiconductor device on a wafer and an apparatus for it.

BACKGROUND OF THE INVENTION

As the device geometries shrink, the requirements for overlay and critical dimensions (CDs) become increasingly stringent and require more precision. In addition to the difficulty in achieving the accurate overlay, the ability to measure (by metrology tools) the feature size or overlay mark is beginning to reach the limits of optical detection techniques. Due to its limitations, optical metrology needs to be replaced by newer technologies.

The present invention seeks to provide a concept for replacing conventional optical overlay and CD metrology by a newer technique which mitigates or avoids the disadvantages and limitations of the prior art.

DETAILED DESCRIPTION OF A PREFERRED EMBODIMENT

According to the present invention conventional optical overlay metrology is replaced with a metrology technique that is not currently used for lithography measurements. This technique can also be applied to measure critical dimensions (CDs) of the sub-micrometer features that are being printed on a wafer in the same module. The technique used by this invention is atomic force microscopy (AFM). The microscopy module is located within the lithography cell. This tool provides for atomic scale alignment and feature measurement accuracy. One advantage of the proposed technique is that this system is not prone to the errors associated with optical metrology.

Figure 1:
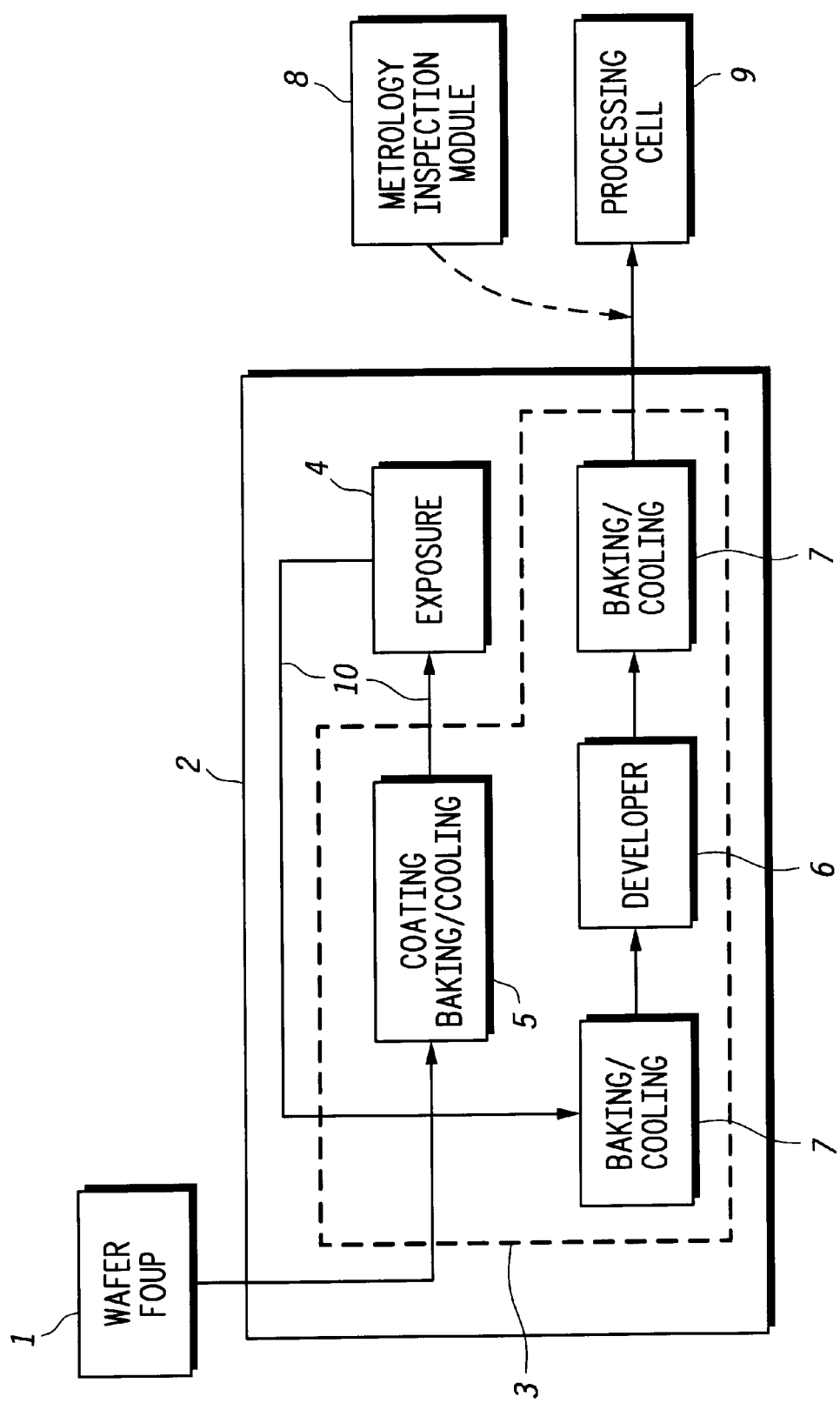
FIG. 1 illustrates a lithography apparatus according to prior art.

Referring to FIG. 1, there is shown a prior art design of a lithography cell and relevant adjacent tools. The wafers to be processed are carried in a Front Opening Unified Pod (FOUP) 1 which contains e.g. 25 wafers of 300 mm diameter. The wafer FOUP 1 enters into a lithography cell 2 which comprises as main components a coater tool 3 and an exposure tool 4. The lithography cell 2 is indicated by a rectangle with fat lines which encompasses the coater tool 3 and the exposure tool 4 as its components. The coater tool 3 is indicated by a polygon with dashed lines, it comprises a coating means 5, a developer means 6 and a plurality of stabilization means 7 for baking/cooling the wafer. (In the following the term "baking" the wafer is meant to comprise also subsequent "cooling" of the wafer.) After finishing the processing steps in the lithography cell 2 the wafer is passed on to a processing cell 9 for etching, wet processing or ion implantation.

The tools for lithography processing of the wafer are arranged in a loop, the transportation paths 10 of the wafers between two adjacent processing means being indicated by solid lines (arrows). The wafer first enters the coating means 5 in the coater tool 3, where it is coated with a lithography resist. After the coating the wafer is baked and cooled in order to stabilize the lithography resist on it. Thereafter the wafer is passed on to said exposure tool 4, which is normally external to the coating tool 3 since, concerning the physical environment, the requirements for the exposure parameters and environment are different from the requirements for coating, developing and baking/cooling. In the exposure tool 4, the wafer is exposed to irradiation with light, X-rays, electrons or ions through a reticle (not shown). After the exposure in the exposure tool 4 the wafer is returned to the coater tool 3 where it is baked and cooled in order to stabilize the exposed lithography resist on it in a first stabilization means 7. The wafer then enters the developer means 6 in which it is developed and afterwards it is passed on to a second stabilization means 7 for baking the resist pattern on the surface of the wafer. Accordingly, there are multiple wafers concurrently processed at a time: e.g. one wafer in the coating means 5, being coated with resist, one wafer in the exposure tool 4, being irradiated with light, electrons, ions etc., and one wafer in the developer means 6 or in one of the stabilization means 7. After the second stabilization means 7 the wafer exits the lithography cell 2 and enters the processing cell 9 (such as an etcher, an ion implanter or the like) for the further processing.

Before the wafer enters the processing cell 9 for the further processing, a metrology inspection of the patterns on its surface is carried out in order to reject wafers with features on their surface that are not properly oriented with respect to the wafer because a misalignment of the wafer and processing means in the lithography cell occurred during the preceding lithography step or specific feature sizes have become too small or too large. This metrology inspection is carried out in a separate metrology inspection tool 8, external to the lithography cell 2 and the processing cell 9, respectively.

However, this inspection is carried out after a whole batch of wafers in the respective FOUP 1 has been processed. If therefore it is detected that the first inspected wafer is defective, it can immediately be inferred that the whole batch is defective. In this case all wafers of the batch have to be re-processed, which is time consuming and expensive.

Figure 3:
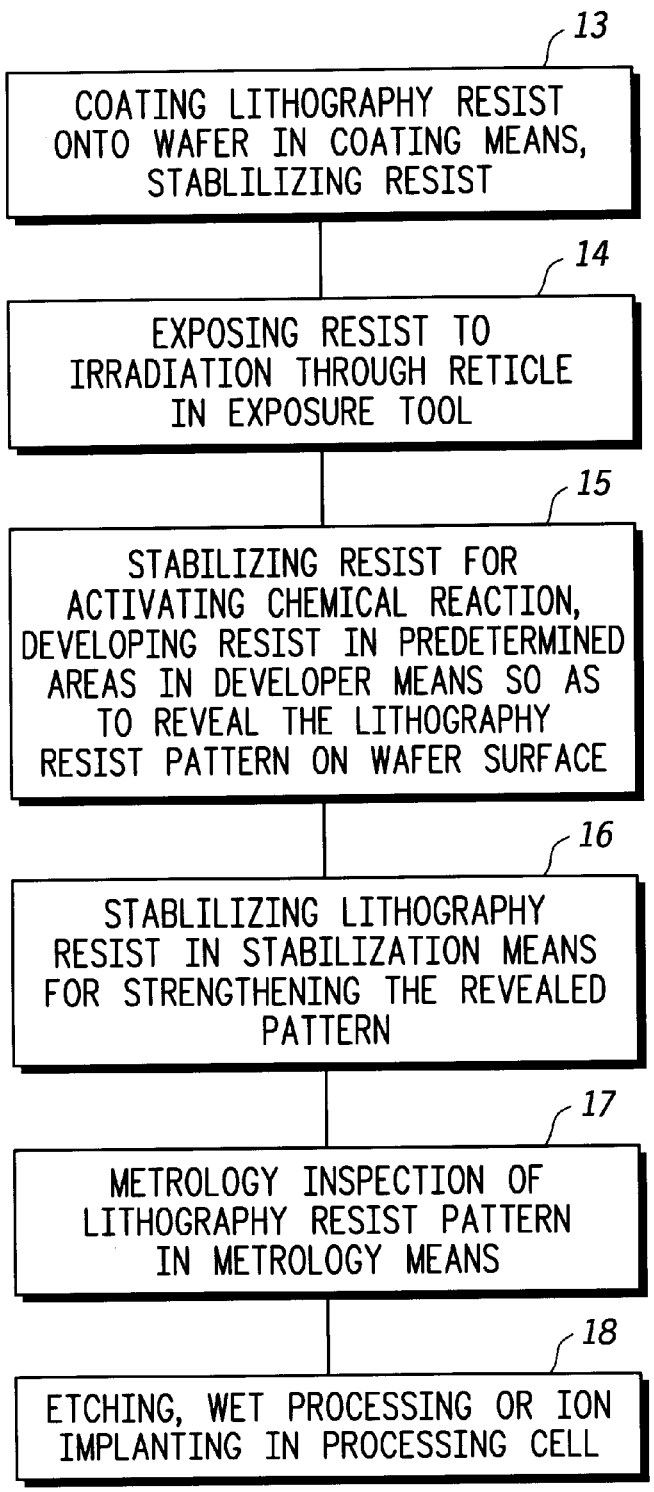
FIG. 3 is a flowchart of the lithography for a semiconductor device on a wafer according to prior art.

The according steps of the pertaining prior art process are presented in FIG. 3. Referring to FIG. 3, in an initial step 13 the wafer is coated with a lithography resist and baked and cooled afterwards in said coating means 5 in order to stabilize the lithography resist on it. Subsequently, at step 14, the wafer with the resist on it is exposed to irradiation with deep UV light, extreme UV light, X-rays, electron or ion beams in the exposure tool 4 through a reticle (not shown), and the wafer is baked and cooled in a first stabilization means 7 in order to stabilize the lithography resist on it. After stabilization and activating chemical reaction in the resist, the resist is developed in the developer means 6 at step 15 for revealing resist patterns on the wafer surface. The developed lithography resist is again stabilized by baking and subsequent cooling in a second stabilization means 7 at step 16 for strengthening the pattern on the wafer surface. After the following metrology inspection in the according module 8 at step 17 the batch of wafers is passed on to the processing cell 9. In the processing cell 9 the wafer is etched, wet processed or ion implanted at step 18.

Figure 2:
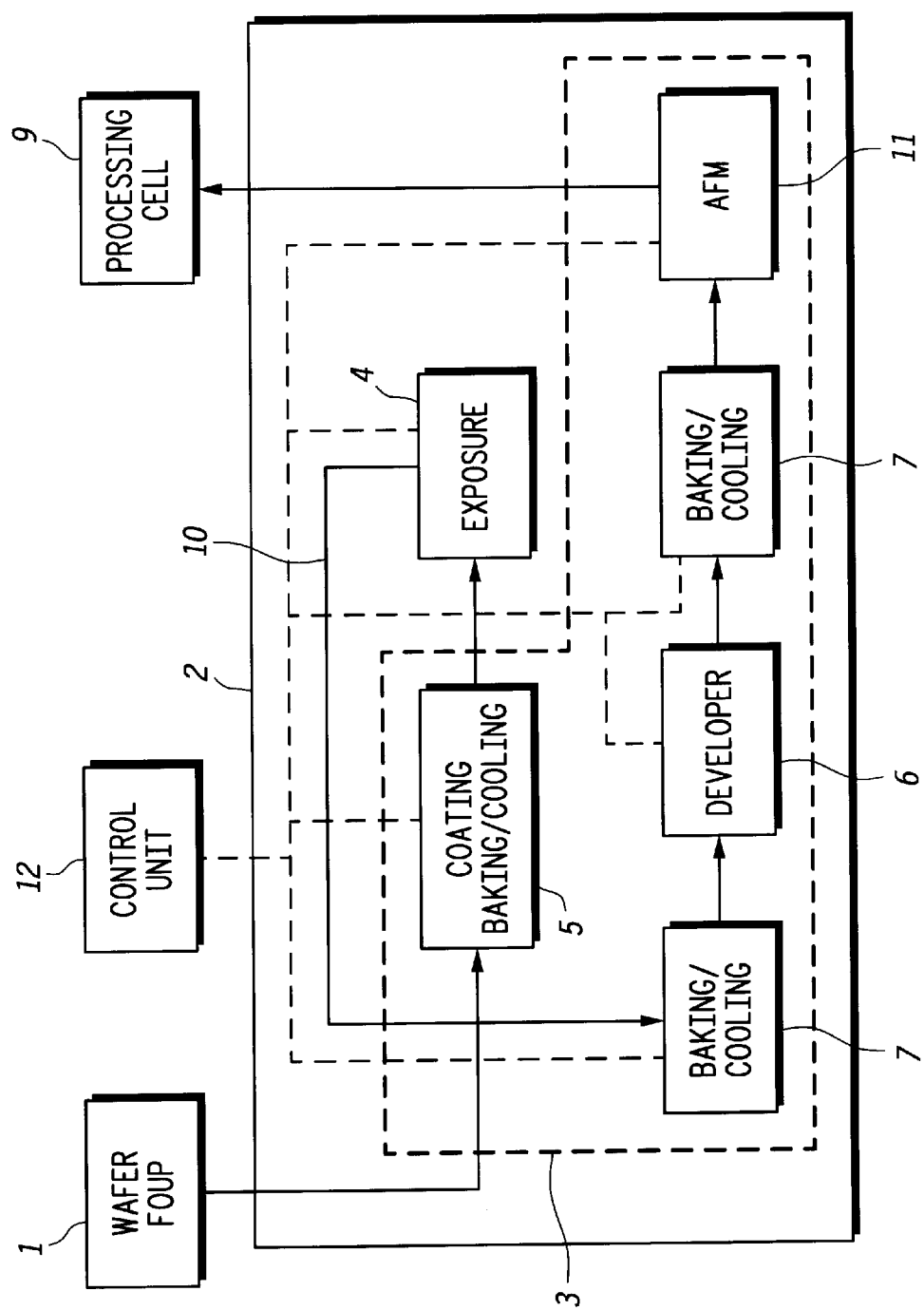
FIG. 2 illustrates a lithography apparatus according to an embodiment of the present invention.

According to the invention, there is provided a more direct monitoring of the wafers in step 17. Namely, the metrology inspection tool 8 is directly attached to the lithography cell 2 behind the second stabilization means 7. This location for the module in the lithography resist track enables measuring wafers in situ after finishing the develop and baking steps. The design of the lithography cell 2 according to the invention is illustrated in FIG. 2. Referring to FIG. 2, the lithography cell 2 basically comprises the same main elements as in FIG. 1. However, the metrology inspection in FIG. 2 is carried out immediately after finishing the baking, since the metrology module is incorporated into the lithography cell 2 adjacent to the second stabilization means 7. If at step 17 there is detected any out-of-spec condition of the wafer, the processing of the batch of wafers can be halted with the least number of rejected wafers, namely only four wafers would have to be re-done, i.e. the one that is presently inspected (that has just finished the develop and baking step), one in the developer means 6, one in said stabilization means 7, and the one in the exposure tool 4. A fifth wafer in the coating means 5 (before the exposure tool) would not be affected. This is a great advantage in comparison with the prior art where the metrology inspection is carried out in a separate metrology module after coating, exposure, developing and baking of all 25 wafers in said FOUP 1 and the whole batch of wafers would have to be re-done before re-introducing them into the process of manufacture.

For inspection of very minute features on the surface of the wafer the inspection is also carried out with an atomic force microscopy module 11. The atomic force microscope 11 comprises piezo-driven cantilevers with a tip at the free end of it (e.g., either SiC tips, diamond tips or so-called buckyballs). The tip traverses the wafer, scanning the pattern on its surface (either the wafer being translated on a stage (not shown), or the cantilever being drawn across the wafer). The tip at the end of the cantilever is attracted or repelled by the features on the wafer in a direction that is substantially perpendicular to the wafer surface. The vertical translations of the tip are detected by a piezoelectric detector which generates a varying electrical signal, that is then applied to an amplifier and is evaluated by a computer (not shown).

Using integrated micro-devices combining electrical and mechanical components, with sensors, mechanisms and electronics integrated on a chip as microelectro-mechanical systems (MEMS), an inexpensive array can be built to accomplish the simultaneous measurements with any wafer pattern layout spacing needed. Preferably multiple stylus positions are used at preset areas on the wafer to obtain measurements on normal sites to provide better wafer throughput. This reduces the data acquisition time if a movable stage (not shown) with limited range of motion such as a piezoelectric stage is employed. Alternatively, this can be done on stand-alone AFM systems that are modified for movable stage for the simultaneous data acquisition.

According to the invention the atomic force microscopy (AFM) module 11 is provided with a control link to an external control unit 12 which controls the wafer processing and in particular the timing of the steps in the above modules. To that order the external control unit 12 is also coupled to other elements within the lithography cell 2, namely coating means 5, exposure tool 4, developer means 6, and the stabilization means 7. In the AFM module 11 one wafer is inspected at a time. It is automatically examined whether or not the inspected features on it correspond to a previously stored template or a database. The AFM module 11 outputs a control signal which is at least capable of assuming a first and a second predetermined logic state. This control signal is conveyed on a said control links to the external control unit 12, and thus indirectly to the other modules within the lithography cell 2. The control links are presented as dash-dotted lines (arrows) in FIG. 2. Upon detection of any out-of-spec condition of a wafer being examined in the atomic force microscopy module 11, the control signal takes on a predetermined logic state indicating that the examined wafer does not comply with the its specifications (the opposite logic state of the control signal indicates accordingly that the process is to continue) and is transmitted to the other elements of the lithography cell 2 via the control links. The processing of the following wafers in the lithography cell 2 is automatically halted upon receiving the control signal of which the logic state indicates that the examined wafer does not comply with the its specifications and the operator of the lithography apparatus is enabled e.g. to re-align the wafer on the stage (not shown) or change exposure parameters for critical dimensions in the exposure tool 4. As mentioned above, this ensures the most direct and immediate reaction to any misalignment of the wafer to any of the components in the lithography cell 2.

Figure 4:
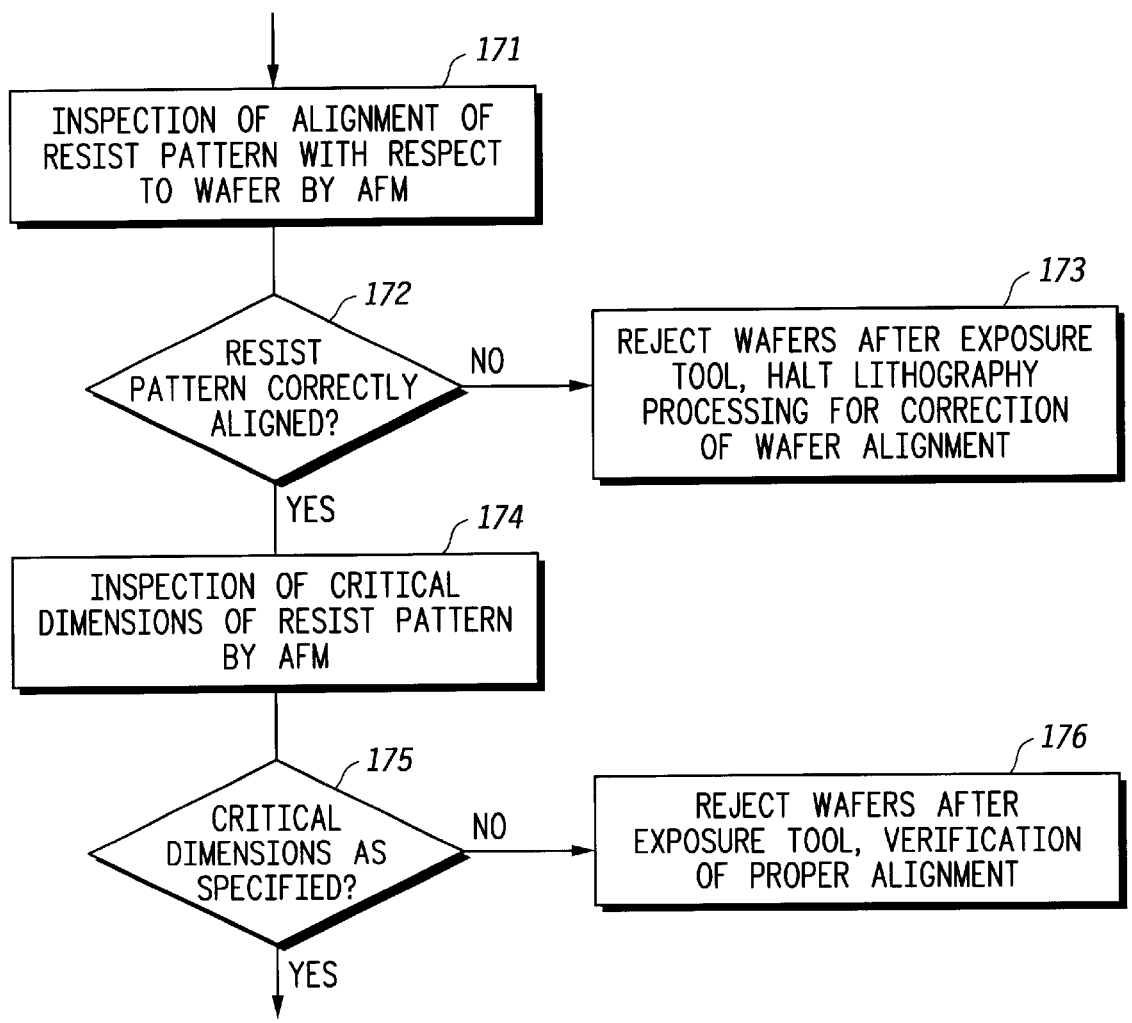
FIG. 4 is a part of the flowchart of FIG. 3 in detail that embodies the present invention.

Referring to FIG. 4, there is shown the detailed list of sub-steps of step 17 in the flowchart of FIG. 3. The sequence of sub-steps in FIG. 4 starts at the inspection of the alignment of the lithography resist pattern with respect to the wafer, step 171. At step 172 it is determined whether or not the alignment of the pattern on the wafer surface is correct. If the wafer is correctly aligned and the pattern on it is correctly oriented the processing is continued at step 174. Otherwise, if the resist pattern is not correctly aligned the inspected wafer is rejected and excluded from the further processing in the processing cell 9, and the lithography processing is halted in order to enable the operator reject all wafers after the exposure tool 4, to determine any fault in the lithography set up and to correct the alignment of the wafer. (Although in general only the wafer will be moved for an adjustment, in principle also the reticle could be subject to a fine adjustment.) At step 174 critical dimensions of the resist pattern on the wafer surface are inspected. The result of this inspection is determined at step 175. If the wafer has passed both the inspection of the alignment and of the critical dimensions, it exits to the processing cell 9. If however, any of the critical dimensions of said pattern are not as specified, the wafer is rejected at step 176 and excluded from the further processing and the processing of the wafers in the lithography cell 2 is halted for service; the operator is given the opportunity to remove all wafers after the exposure tool 4 and to verify the proper alignment of system components or process parameters in the lithography cell 2.

In brief, the AFM module measures overlay followed by critical dimensions. If out-of-spec conditions are determined, an error message is initialized that is fed back into a control unit (not shown). Based on this automated response of the atomic force microscopy module 11 the control unit may sort out the indicated wafer during the processing of the batch of wafers in an active feedback loop.

In the following the main advantages of the invention in industrial application are listed:

The use of AFM on a litho cluster for CD and overlay measurement ensures improved process monitoring and reduced rework times. Integration of the AFM module within the lithography cell provides a reduced cycle time for device production and also enables physical measurement of features and overlay where optical methods are ineffective.

The throughput of wafers in the lithography cell is increased by the multiple AFM styli positions in the AFM module. The CD and overlay control for design features that cannot be measured accurately using existing optical techniques is improved by AFM. The level of accuracy is higher, the correlation of in tool measurements to out of tool measurements becomes feasible, the need for alignment measurements in the exposure tool may be negated.

While the invention has been described in terms of particular structures, devices and methods, those of skill in the art will understand based on the description herein that it is not limited merely to such examples and that the full scope of the invention is properly determined by the claims that follow.

What is claimed is:

1. A lithography method for forming at least one semiconductor device on a wafer comprising the steps of:
   coating a lithography resist onto said wafer in a coating means,
   exposing said wafer to an irradiation through a reticle in an exposure tool,
   stabilizing said lithography resist for activating chemical reaction and developing said lithography resist in said predetermined areas in a developer means so as to reveal a predetermined lithography resist pattern on the wafer surface,
   stabilizing the lithography resist in a stabilization means for strengthening said pattern on the wafer surface,
   performing a metrology inspection of said lithography resist pattern on said wafer surface in a metrology tool, wherein said metrology inspection is performed by atomic force microscopy in an atomic force microscopy (AFM) module which examines critical dimensions of the lithography resist pattern on the wafer surface and creates a control signal in response to the examination result that is capable of assuming two predetermined logic states indicating either the compliance of said critical dimensions with predetermined specifications or not, and
   selectively changing exposure parameters in response to the control signal.

2. Method according to claim 1, wherein said lithography resist comprises at least one of a DUV-, an EUV-photoresist, an X-ray resist, an electron lithography resist, and an ion beam resist.

3. Method according to claim 1, further comprising:
   etching, wet processing or implanting ions into said wafer in a processing cell if said control signal indicates the compliance of said critical dimensions with said predetermined specifications.

4. Method according to claim 1, wherein the selectively changed exposure parameters are used to process a second wafer.

5. A lithography method for forming at least one semiconductor device on a wafer comprising the steps of:
   coating a lithography resist onto said wafer in a coating means,
   exposing said wafer to an irradiation through a reticle in an exposure tool,
   stabilizing said lithography resist for activating chemical reaction and developing said lithography resist in said predetermined areas in a developer means so as to reveal a predetermined lithography resist pattern on the wafer surface,
   stabilizing the lithography resist in a stabilization means for strengthening said pattern on the wafer surface,
   performing a metrology inspection of said lithography resist pattern on said wafer surface in a metrology tool, wherein said metrology inspection is performed by atomic force microscopy in an atomic force microscopy (AFM) module which examines the alignment of the lithography resist with respect to the wafer and creates an error signal in response to the examination result indicating either the correct alignment or an incorrect alignment of the wafer, and
   selectively adjusting alignment of said wafer in response to the error signal.

6. Method according to claim 5, further comprising:
   etching, wet processing or implanting ions into said wafer in a processing cell if the error signal indicates the correct alignment of said wafer.

7. Method according to claim 5, wherein the selectively adjusted alignment is used to process a second wafer.

8. A lithography method for forming at least one semiconductor device on a wafer comprising the steps of:
   coating a lithography resist onto said wafer in a coating means,
   exposing said wafer to an irradiation through a reticle in an exposure tool,
   stabilizing said lithography resist for activating chemical reaction and developing said lithography resist in said predetermined areas in a developer means so as to reveal a predetermined lithography resist pattern on the wafer surface,
   stabilizing the lithography resist in a stabilization means for strengthening said pattern on the wafer surface,
   performing a metrology inspection of said lithography resist pattern on said wafer surface in a metrology tool, wherein said metrology inspection is performed by atomic force microscopy in an atomic force microscopy (AFM) module which inspects at least one of alignment or critical dimensions of said wafer and generates a control signal in response to inspecting,
   in response to said control signal, selectively adjusting alignment or selectively changing exposure parameters, and
   selectively providing said wafer to a processing cell based on said control signal.

9. The method of claim 8, wherein the selectively changed exposure parameters are used to process a second wafer.

10. The method of claim 8, wherein the selectively adjusted alignment is used to process a second wafer.

11. The method of claim 8, wherein a first predetermined logic state of said control signal indicates at least one of an incorrect alignment of said wafer or a deviation of the critical dimensions from predetermined specifications.

12. The method of claim 11, wherein a second predetermined logic state of said control signal indicates a correct alignment of said wafer and compliance of said critical dimensions with said predetermined specifications.

13. The method of claim 12, wherein selectively providing said wafer to the processing cell is performed such that the wafer is provided to the processing cell if said control signal has the second predetermined logic state.

* * * * *